United States Patent [19]

Platzer

[11] Patent Number: 4,902,594
[45] Date of Patent: Feb. 20, 1990

[54] TRANSFERRABLE, THERMOPLASTIC, ANTIBLOCKING/ADHESIVE PROTECTING LAYER FOR IMAGES

[75] Inventor: Stephan J. W. Platzer, Califon, N.J.

[73] Assignee: Hoechst Celanese Corporation, Somerville, N.J.

[21] Appl. No.: 261,383

[22] Filed: Oct. 21, 1988

[51] Int. Cl.$^4$ .................. G03C 11/00; B32B 31/00
[52] U.S. Cl. ........................... 430/14; 430/258; 430/357; 430/432; 430/950; 430/961; 156/230; 156/249
[58] Field of Search ............... 156/230, 249; 430/357, 430/432, 961, 14, 258, 950

[56] References Cited

U.S. PATENT DOCUMENTS

| 4,060,441 | 11/1977 | Ohta et al. | 156/230 |
| 4,378,392 | 3/1983 | Segel | 156/249 |
| 4,522,881 | 6/1985 | Kobayashi et al. | 430/961 |
| 4,719,169 | 1/1988 | Platzer et al. | |

Primary Examiner—Paul R. Michl
Assistant Examiner—Janet C. Barker
Attorney, Agent, or Firm—Plottel & Roberts

[57] ABSTRACT

A photoimaged article having a protected image composed of a colored image on a support; and a thin, transparent, flexible, nonself supporting, protective layer on the surface of the image. The layer is substantially non-tacky at room temperature, and has at least a major amount based on the weight of the layer of one or more thermoplastic resins of a vinyl acetal, vinyl chloride, or acrylic polymer or copolymer having a Tg of from about 35° C. to about 110° C. The layer is capable of being adhesively transferred directly to the image when the layer is first applied on the release surface of a temporary support, and the image and protective layer are laminated together under pressure at temperatures of between about 60° C. to about 180° C. with subsequent removal of the temporary support. The side of said layer opposite to the image is free from additional layers. The adhesive layer is one which does no cohesively block at temperatures ofabout 50° or less.

11 Claims, No Drawings

TRANSFERRABLE, THERMOPLASTIC, ANTIBLOCKING/ADHESIVE PROTECTING LAYER FOR IMAGES

BACKGROUND OF THE INVENTION

In the technology of lithographic printing, a printer will typically produce a series of metal based lithographic printing plates which will be used to reproduce an original many thousands of times. However, metal based presensitized printing plates are expensive and errors in the image can cause considerable unnecessary expense. It has therefore become customary and desirable to produce an inexpensive color proof to assist a printer in judging the quality of, and correcting a set of photographic color separation films prior to starting the expensive lithographic printing process.

Color proofing films are used to reproduce the color quality that will be obtained during the actual printing process. The proof must be a consistent duplicate of the desired half tone or line image. Visual examination of a color proof should reveal the color rendition to be expected and any flaws on the separations which might need to be altered before making the printing plates. Color proofing sheets for multicolored printing can be made by using a printing press or proof press. This requires taking all the steps necessary for actual multicolor printing. Such a conventional method of color proofing has itself been costly and time consuming. Alternate color proofing methods have therefore been developed to simulate the quality of press proofs. There are several types of photoimaging color proofing methods. These include, namely, the overlay type and the single sheet type.

In the overlay type of color proofing, an independent transparent plastic support is used for producing an image of each color separation film. A number of such supports carrying colored images are then superimposed upon each other and held on a white sheet to produce a color proof. The overlay type of color proofing method has the disadvantage that the superimposed plastic supports tend to darken the color proof, and, as a result, the impression of the color proof thus prepared becomes vastly different from copies actually obtained with a conventional printing press. Its primary advantage is that it is quick and can serve as a progressive proof by combining any two or more colors in register.

In the single sheet type of color proofing method, a color proofing sheet is prepared by successively producing images of different colors from different color separation films onto a single receptor sheet. This is done by utilizing a single opaque support and by applying toners, photosensitive solutions or coatings of photosensitive materials of corresponding colors on the opaque support in succession. An advantage of the single sheet type of color proof is that the color saturation is not influenced by superimposed plastic supports. This method more closely resembles the actual printing process and eliminates the color distortion inherent in the overlay system.

The present invention relates to negative-working and positive-working proofing sheets of the single sheet color proofing class. Films of this type are generally composed of a sheet substrate and at least a colored photosensitive layer on the sheet. An adhesive layer may be disposed on the photosensitive layer.

An example of a negative-working, single sheet approach is described in U.S. Pat. No. 3,671,236. The presensitized element comprises a substrate having a release surface, a pigmented photosensitive layer in contact with the release surface, a pressure sensitive adhesive layer, and a barrier layer between the photosensitive layer and the adhesive layer. The primary function of the barrier layer is to prevent pigment staining on the adhesive during development. The element is used by laminating it to a receiver via the adhesive layer. The substrate is removed, the photosensitive layer is exposed, and the material is processed in a solvent medium. These steps are generally repeated three times to produce a multicolored proof.

An example of a positive-working, single sheet approach is given in U.S. Pat. No. 4,260,673. The presensitized element comprises a substrate having a release surface, a pigmented photosensitive layer in contact with the release surface, a heat sensitive adhesive layer, and a binder layer between the pigmented layer and the adhesive layer. The binder layer comprises a photosensitive compound and prevents pigment staining of the adhesive. The element is processed like the negative-working element in U.S. Pat. No. 3,671,236.

Examples of negative-working and positive-working, single sheet approaches without preventative layers between the photosensitive and adhesive layers are described in U.S. Pat. Nos. 4,650,738 and 4,659,642, respectively. The presensitized elements comprise a sheet having a release surface, a colored photosensitive layer in contact with the release surface, and an adhesive layer directly adhered to said colored layer.

The one problem with single sheet proofing systems is that the image is vulnerable to damage from its environment, i.e., from fingerprints, scratches, dust and the like. To protect the surface of the single sheet proof, it is common to laminate to such surface a thin, self supporting, transparent film of polyester or the like, or a layer of photopolymer which may be polymerized by overall exposure to actinic radiation to form a tough, protective membrane. This postexposure requires an additional processing step. These prior practices, however, generally result in the formation of a thick, glossy surface on the print which in some circumstances detracts from the desired appearance of the proof. For example, a transparent, pressure sensitive cellophane tape can be applied over the final image. However, in many instances, it is preferred that the surface of a proof exhibit a matte texture to closely resemble actual printing on stock which is not glossy.

Various means have been attempted to reduce the glossy appearance of single sheet proofs, yet none has proven sufficiently simple and effective. The application to the surface of the print of powdered pigments, pigmented sprays or lacquers, or aqueous dispersions of pigments, all as mentioned, for example in U.S. Pat. No. 4,286,046, poses problems of expense, cleanliness, and health while failing to provide a matte of acceptable uniformity, texture, and appearance.

One solution to this problem has been proposed by U.S. Pat. No. 4,719,169. In this disclosure, a thermoplastic adhesive layer and an antiblocking layer are borne on one or two temporary supports and are then laminated to the proof. The temporary supports are then stripped off. The proof is itself thereby provided with either a smooth or matte finish depending upon the surface topography of the temporary support from which the aforementioned layers were removed. The two layers are somewhat disadvantageous for some applications. The present invention seeks to improve on this patent by employing a single protective layer which has both thermoplastic and antiblocking properties. Thus only a single layer is applied to the image. This allows a covering which is thinner and reduces dot gain.

SUMMARY OF THE INVENTION

The present invention provides a photoimaged article having an improved protected image which comprises:

(A) a colored image disposed on a support; and (B) a single, thin, transparent, flexible, nonself supporting, protective layer directly on the surface of the image, wherein said layer is substantially nontacky at room temperature; wherein said layer comprises at least a major amount based on the weight of said layer of one or more thermoplastic resins; preferably having a Tg of from about 35° C. to about 110° C.; and wherein said layer does not cohesively block at temperatures of about 50° C. or less; and wherein said layer is transferable directly to said image when the layer is first disposed on a release surface of a temporary support, and said image and layer are laminated together under pressure at temperatures of between about 60° C. and about 180° C. and said temporary support is peeled away.

The invention also provides a method for protecting an image which comprises:

(A) providing a colored image on a support;

(B) providing a protective layer disposed on a release surface of a temporary support; wherein said layer is a single, thin, transparent, flexible, nonself supporting, composition layer; wherein said layer is substantially nontacky at room temperature; and wherein said layer comprises at least a major amount based on the weight of the layer of one or more thermoplastic resins preferably having a Tg of from about 35° C. to about 110° C.; wherein said layer does not cohesively block at temperatures of about 50° C. or less;

(C) laminating said layer directly to said colored image under pressure at temperatures of between 60° C. and about 180° C.; and (D) peeling away said temporary support thus leaving the protective layer on the colored image.

DETAILED DESCRIPTION OF THE PREFERRED EMBODIMENT

In the process of the present invention, one employs a photoimaged element which comprises a support having a colored image thereon. Such photoimaged elements are as such not new. In the preferred embodiment, the support is composed of a dimensionally stable base material which does not significantly change its size or color as the result of the heated lamination step or any other treatments which it might undergo. One preferred material is polyethylene terephthalate. In the usual case it has a thickness of from about 1 to about 20 mils, or a more preferred thickness of from about 2 to about 10 mils. Suitable supports include Melinex 329, 339, 994, and 3020 available from ICI. Other white and nonwhite supports may also be used. Rough textured and/or adhesion promoted surfaces are preferred. Paper or plastic coated paper may also be used if dimensionally and chemically stable. Bonded to the support is a colored image. In the preferred embodiment, this image is comprised of four individual, color separated images which are adhered to one another to form a full color representation of an image. The four colors are normally cyan, magenta, yellow, and black. Each image usually comprises a colored photosensitive material which has been imagewise exposed and developed.

The photosensitive layer comprises a photosensitizer, a colorant, a binding resin, and other optional ingredients such as plasticizers, stabilizers, surfactants, antistatic compositions, uv absorbers, spectral sensitizers, optical brighteners, inert fillers, exposure indicators, polymerization inhibitors, oligomers, hydrogen atom donors, antihalation agents, photoactivators, and residual coating solvents.

In one embodiment, the photosensitizer is preferably a light sensitive, negative-working polymeric diazonium salt. The most preferred photosensitizer is the polycondensation product of 3-methoxy-4-diazo-diphenyl amine sulfate and 4,4,-bis-methoxy methyl-diphenyl ether, precipitated as mesitylene sulfonate as taught in U.S. Pat. No. 3,849,392. Other suitable photosensitizers are taught in U.S. Pat. No. 4,436,804. The diazo compounds of choice are preferably soluble in organic solvents.

In another embodiment, the photosensitizer is preferably a light sensitive, positive-working naphthoquinone diazide. The most preferred photosensitizer is the ester of bis-(3-benzoyl-4,5,6trihydroxyphenyl)methane and 2-diazo-1-naphthol-5-sulfonic acid as taught in U.S. Pat. No. 4,407,926. Other suitable photosensitizers are taught in U.S. Pat. Nos. 3,106,365; 3,148,983; 3,201,239; and 4,266,001. The diazide compounds of choice are preferably soluble in organic solvents.

In yet another embodiment, the photosensitizer comprises a photopolymerizable monomer or oligomer component, and a photoinitiator. Examples of such photosensitizers are given in U.S. Pat. No. 4,596,757. The photopolymerizable material contained in the colored layer usually comprises an addition polymerizable, nongaseous (boiling temperature above 100° C. at normal atmospheric pressure), ethylenically-unsaturated compounds containing at least two terminal ethylene groups, and being capable of forming a high molecular weight polymer by free radical initiated, chain propagating addition polymerization. Suitable polymerizable materials nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerthritol triacrylate, bisphenol A ethoxylate dimethacrylate, trimethylolpropane ethoxylate triacrylate, and trimethylolpropane propoxylate triacrylate.

Free radical liberating photoinitiators include any compound which liberate free radicals on stimulation by actinic radiation. Preferred photoinitiators nonexclusively include quinoxaline compounds as described in U.S. Pat. No. 3,765,898; the vicinal polyketaldonyl compounds in U.S. Pat. No. 2,367,660; the alphacarbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon-substituted aromatic acyloins in U.S. Pat. No. 2,722,512; polynuclear quinones in U.S. Pat. Nos. 2,951,758 and 3,046,127; and s-triazines in U.S. Pat. No. 4,656,272.

Dyes and/or pigments are included in the photosensitive layer to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometer.

Nonexclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (C.I. 73915), Hostaperm Red Violet ER (C.I. 46500), Permanent Carmine FBB (C.I. 12485), Hostaperm Blue B2G (C.I. 74160), Hostaperm Blue A2R (C.I. 74160), and Printex 25. Most of these are products of Hoechst AG. They can be used separately or blended for a desired color.

Binders found suitable for the photosensitive layer are styrene/maleic anhydride copolymers and their half esters; acrylic polymers and copolymers; polyamides; polyvinyl pyrrolidones; cellulose and its derivatives; phenolic resins; and polyvinyl acetals, such as polyvinyl formal, polyvinyl butyral, and polyvinyl propional.

Dyes may be included to spectrally sensitize the photoinitiator, such as described in U.S. Pat. Nos. 4,282,309 and 4,454,218, and European Patent Application Nos. 0,179,448 and 0,211,615.

In the practice of the present invention, the binder component is preferably present in the photosensitive layer in an amount sufficient to bind the composition components in a uniform mixture and a uniform film when it is coated on a substrate. It is preferably present in a amount ranging from about 10% to about 80% based on the weight of the solids in the layer. A more preferred range is from about 20% to about 70%.

In the preferred embodiment, when a diazonium salt or diazide compound is the photosensitizer component, it is present in the photosensitive layer in an amount of from about 5% to about 70% by weight; or more preferably from about 10% to about 50% by weight.

In the practice of the present invention, when a photoinitiator compound is used, it is preferably present in the photosensitive layer in a amount sufficient to initiate the free radical polymerization of the unsaturated component upon exposure to imaging energy. It is preferably present in an amount ranging from about 2% to about 30% based on the weight of the solids in the layer. A more preferred range is from about 6% to about 20%.

In the practice of the present invention, the colorant component is preferably present in an amount sufficient to uniformly color the photosensitive layer. It is preferably present in an amount ranging from about 5% to about 50% based on the weight of the solids in the layer. A more preferred range is from about 10% to about 40%.

In the practice of the present invention, when an unsaturated component is used, it is preferably present in the photosensitive layer in an amount sufficient to cause an imagewise latent differential in the polymerizable composition when it is coated on a substrate and imagewise exposed to imaging energy. It is preferably present in an amount ranging from about 10% to about 60% based on the weight of the solids in the layer. A more preferred range is from about 15% to about 40%.

Suitable acid stabilizers useful within the context of this invention include citric, benzoic, m-nitro benzoic, p(p-anilino phenylazo) benzene sulfonic acid, 4,4,-dinitro-2,2,-stilbene disulfonic, itaconic, tartaric, and p-toluene sulfonic acid, and mixtures thereof. Preferably, the acid stabilizer is phosphoric acid.

Exposure indicators (or photoimagers) which may be useful in conjunction with the present invention include eosin, azobenzene, Calcozine Fuchine, Crystal Violet, and Methylene Blue dyes. Preferably, the exposure indicator is 4-phenylazodiphenylamine.

A plasticizer may also be included in the composition of this invention to prevent coating brittleness and to keep the composition pliable if desired. Suitable plasticizers include dibutylphthalate, triarylphosphate and substituted analogs thereof an preferably dioctylphthalate.

To form a coating composition for the production of the photosensitive elements, the composition of this invention may be dissolved in a solvent or mixture of solvents to facilitate application of the composition to the substrate. Suitable solvents for this purpose may include water, tetrahydrofuran, gamma butyrolactone, glycol ethers such as propylene glycol monomethyl ether and methyl cellosolve, alcohols such as ethanol and n-propanol and ketones such as methyl ethyl ketone. In general, the solvent system is evaporated from the coating composition once it is applied to an appropriate substrate. However, some insignificant amount of solvent may remain as residue.

In the preferred embodiment, the photosensitive solution is coated onto a release surface of a substrate and then dried. The photosensitive layer has a coating weight between approximately 0.1 and 5.0g/$m^2$. The most preferred weight is from about 0.5 to 2.0g/$m^2$.

The substrate for the photosensitive layer is composed of a dimensionally and chemically stable base material. One preferred material is transparent polyethylene terephthalate. In the usual case, it has a thickness of from about 1 to about 10 mils, a more preferred thickness is from about 2 to about 5 mils, and most preferably from about 2 to about 3 mils. Suitable films include Hostaphan 3000 available from Hoechst Celanese Corporation; Mylar D available from DuPont, and Melinex 516 available from ICI. The surface of the substrate may be smooth or may be provided with a matte texture by various methods known in the art. Matte films include Melinex 377 and 470 from ICI. The substrate must have a release surface, that is, it must be capable of releasably holding the photosensitive layer thereto. This may be accomplished by either the substrate surface being inherently releasable, being rendered releasable by a suitable treatment, or being provided with a release layer over the substrate surface. Such a release layer may comprise polyvinyl alcohol.

An optional adhesive layer can be directly disposed on the photosensitive layer. The purpose of the optional adhesive layer is to aid in the transfer of the photosensitive layer and to protect the integrity of underlying, previous formed images during development of subsequent layer or layers. It may be applied to the photosensitive layer in several different ways. It can be coated directly onto the photosensitive layer out of organic or aqueous based solvent mixtures, or it can be applied by hot melt extrusion, lamination, or coating. The optional adhesive layer on the photosensitive layer preferably comprises a major amount of one or more thermoplastic polymers and may optionally contain such other desired components as uv absorbers, antistatic compositions, optical brighteners, inert fillers, and plasticizers. Suitable polymers nonexclusively include vinyl acetal resins such as Butvar B-79 available from Monsanto; acrylic resins such as Elvacite 2044 available from DuPont; ethylene resins such as Elvax 210 available from DuPont; and vinyl chloride resins such as Hostaflex CM 133 available from Hoechst AG. Preferably the polymer is a vinyl acetate polymer or copolymer. Useful polyvinyl acetates nonexclusively include Mowilith DM-6, DM-22, 20, 25, 30 and mixtures thereof, available from Hoechst AG. These are usually dispersed in water, or dissolved in methyl isobutyl ketone or n-butyl acetate or other solvent compositions for coating on a photosensitive layer. It is then dried to a coating weight of from about 2 to about 30g/m2, more preferably from about 4 to about 20g/m2. The layer may optionally contain a uv absorber such as Uvinul D-50 available from GAF. It may also contain a plasticizer such as Resoflex R-296, available from Cambridge Industries. It may also contain antistats, such as Gafac and Gafstat available from GAF. It may also contain other resins such s Nitrocellulose RS 1/2, available from Hercules. The adhesive layer should not be tacky to the touch, during storage or during development of the photosensitive element. The layer should be transferable in the range of from about 60° C. to about 180° C., preferably 60° C. to 120° C., or more preferably 60° C. to 100° C. when laminated with heat and pressure. In the preferred embodiment, the thermoplastic polymer or polymers are present in the adhesive layer in an amount of greater than about 50% by weight. The plasticizer may be present in an amount of up to about 30% by weight, the uv absorber up to about 20% by weight, and other resins up to about 50% by weight.

Typical adhesive formulations by weight for the photosensitive element nonexclusively include:

| I. water | 50.00 |
|---|---|
| Mowilith DM-22 | 50.00 |
| II. n-butyl acetate | 78.00 |
| Resoflex R-296 | 1.00 |
| Mowilith 30 | 21.00 |
| III. n-butyl acetate | 68.70 |
| Uvinul D-50 | 1.30 |
| Mowilith 20 | 30.00 |
| IV. n-butyl acetate | 85.00 |
| Mowilith 60 | 15.00 |

In operation, the photosensitive element is laminated to a support via the photosensitive or optional adhesive layer of the photosensitive element. Lamination may be conducted by putting together the photosensitive element and the support in the proper configuration and then introducing the two materials into the nip of a pair of heated laminated rollers under suitable pressure. Suitable laminating temperatures usually range from about 60° C. to about 180° C., preferably about 60° to about 120° C. After lamination, the substrate is peeled away, usually merely employing manual peeling forces. The photosensitive layer plus the adhesive layer when used thus remains on the support.

The photosensitive layer is imagewise exposed by means well known in the art either before or after lamination. Such exposure may be conducted by exposure to a uv light source through a color separation under vacuum frame conditions. Exposures after lamination and peel apart are preferred for photosensitive layer-to-emulsion contact. Mercury vapor discharge lamps are preferred over metal halide lamps. Other radiation sources, such as carbon arc, pulsed xenon, and lasers, may also be used. Light absorbing filters may be used to reduce light scattering in the material.

After transfer and exposure, the photosensitive layer is developed by dissolving the nonimage areas in a suitable developer and dried. Suitable developers nonexclusively include:

| I. water | 95.0 |
|---|---|
| sodium decyl sulphate | 3.0 |
| disodium phosphate | 1.5 |
| sodium metasilicate | 0.5 |
| II. water | 89.264 |
| monsodium phosphate | 0.269 |
| trisodium phosphate | 2.230 |
| sodium tetradecyl sulfate | 8.237 |

Any developer solution which satisfactorily removes the nonimage areas of the photosensitive layer after exposure while retaining the image areas may be used. The selection of developer is well within the ability of the skilled artisan. Development is performed at temperatures below that at which the photosensitive element is nontacky.

The process can then be repeated whereby another photosensitive element having a different color is laminated to the same support over the previous formed image. In the usual case, four colored layers are employed to produce a full color reproduction of a desired image.

According to the present invention, it is desired to protect the aforesaid photoimaged article from fingerprints, scratches, dirt and the like due to handling and transportation. An objective is to produce a thin, durable protective layer for the imaged element. An additional objective is that the protective layer be substantially nonblocking over extended storage periods.

The protective member to be applied to the image comprises a single, thin, transparent, flexible, nonself supporting layer which is laminated directly to the surface of the imaged material. These may be applied in the following manner.

The protective layer is first applied to a temporary support. It may be applied to the support in several different ways. It can be preferably coated directly onto the support out of an organic or aqueous-based solvent mixtures; or it can be applied by hot melt extrusion, lamination, or coating. The composite of protective layer and temporary support is then applied, preferably laminated, to the imaged material with the protective layer in direct contact with the imaged material, with subsequent removal of the temporary support. The adhesive force of the protective layer to its temporary support must be weaker than the adhesive force to the imaged material. It must also be weaker than the cohesive strengths of the imaged material, protective layer, and its temporary support. Suitable laminating temperatures usually range from about 60° C. to about 180° C., preferably from abut 60° C. to about 110° C. The protective layer is therefore in direct contact with the imaged material. No other layer or layers are on the opposite side of the protective layer.

The protective layer on its temporary support may optionally be protected from dirt by using an interleaving material, which is removed prior to lamination. The adhesive forces between the interleaving material and protective layer must be weaker than the adhesive forces between the protective layer and its temporary support. They must also be weaker than the cohesive strengths of the interleaving material, protective layer, and its temporary support. In the preferred embodiment, interleaving material is placed in direct contact with the protective layer opposite to the temporary support.

The temporary support for the protective layer comprises a material which is dimensionally stable under the laminating conditions. These include polyesters, particularly polyethylene terephthalate. The supports may be transparent or opaque, clear or colored. They must have a release layer as does the substrate for the photosensitive layer. Therefore, similar materials can be used for both. In the preferred embodiment, the surface of the substrate may be provided with a matte texture by various methods known in the art. Matte films include Melinex 329, 377, and 470 available from ICI. One can control the gloss of the final image by properly selecting the matte finish of the temporary support for the protective layer. The texture of the temporary support will be the texture of the top surface of the protective layer after transfer to the imaged material. The texture of the protective layer can be further modified by subsequent laminations with a textured material which is removed after lamination. The matting material can be used repeatedly. The texture can also be modified by subsequent treatment with solvents and/or particles which remove part of the protective layer.

The protective layer preferably has a thickness of from about 0.2 to about 20 um, more preferably from about 0.5 to about 10 um, or most preferably from about 1 to about 5 um.

The major portion of the protective layer is a thermoplastic polymer or mixture of thermoplastic polymers which are substantially nontacky at ordinary room temperature. The polymers can be selected from thermoplastic homopolymers and copolymers which have a glass transition temperature (Tg) preferably between about 35° C. and about 110° C., or more preferably between about 50° C. and about 80° C. The thermoplastic polymers should form flexible films. They should preferably be transparent and colorless. The protective layer can also contain plasticizers, uv absorbers, surfactants, antistatic compositions, inert fillers, optical brighteners, and antihalation agents. Useful polymeric plasticizer include Resoflex R296 available from Cambridge Industries. Examples of suitable thermoplastic resins include vinyl formal resins such as Formvar 12/85 available from Monsanto; vinyl propional resins such as described in U.S. Pat. No. 4,670,507, which is incorporated herein by reference; vinyl butyral resins such as Butvar 79 available from Monsanto; vinyl chloride resins such as UCAR VYNC available from Union Carbide; and acrylic resins such as Elvacite 2045 available from DuPont.

The ingredients in the protective layer are selected so that the layer does not cohesively block at about 50 C or less, or preferably at about 70.C or less. Standard methods are used to test for cohesive blocking, such as described in ASTM D1146.

Typical protective layer formulations by weight include:

|   |   |   |
|---|---|---|
| I. | methyl cellosolve | 90 |
|    | Butvar B-79 (Tg = 51° C.) | 10 |
| II. | methyl ethyl ketone | 40 |
|    | isopropyl acetate | 40 |
|    | UCAR VYNC (Tg = 51° C.) | 20 |
| III. | tetrahydrofuran | 20 |

-continued

|   |   |
|---|---|
| n-hexane | 65 |
| Elvacite 2045 (Tg = 55° C.) | 15 |

The following nonlimiting examples serve to illustrate the invention.

EXAMPLE 1

Four photosensitive, negative-working solutions of cyan, yellow, magenta, and black are produced according to the following photosensitive formulations:

|  | Cyan | Yellow | Magenta | Black |
|---|---|---|---|---|
| methyl cellosolve | 41.00 | 41.00 | 46.50 | 41.00 |
| methyl ethyl ketone | 41.00 | 40.99 | 46.48 | 41.00 |
| gamma-butyrolactone | 10.00 | 10.00 | — | 10.00 |
| dimethyl phthalate | 0.75 | 0.75 | 0.88 | 0.75 |
| dibutyl phthalate | 0.25 | 0.25 | — | 0.25 |
| p-toluene sulfonic acid | — | — | 0.18 | 0.35 |
| Scripset 540 | 3.33 | 2.60 | 3.15 | 3.71 |
| Scripset 550 | 1.17 | — | — | — |
| hydrolyzed Scripset 540 | — | — | 0.67 | — |
| SMA 2625 | — | 2.02 | — | — |
| Above diazo from U.S. Pat. No. 3,849,392 | 1.33 | 1.35 | 0.70 | 2.00 |
| phthalo blue pigment | 1.17 | — | — | — |
| yellow pigment | — | 1.04 | — | — |
| magenta pigment | — | — | 1.44 | — |
| black pigment | — | — | — | 0.94 |
| optical density | 1.1 | 0.9 | 1.2 | 1.5 |

Scripset resins are available from Monsanto. SMA resins are available from Arco.

The pigment is introduced as a dispersion of methyl ethyl ketone, Scripset 540, and the appropriate pigment. The solutions are coated and dried separately to the required optical density onto four 3 mil Melinex 516 polyester substrates. The surface densities are roughly 1.3g/m$^2$ for cyan, 0.9g/m$^2$ for yellow, 1.8g/m$^2$ for magenta, and 1.2g/m$^2$ for black. The adhesive solution, in particular adhesive formulation II as described above for the photosensitive layer, is coated on top of the photosensitive layers and dried to a surface density of 12g/m$^2$. The yellow composite is then laminated at 90° C. via the adhesive layer to a 7 mil Melinex 3020 white polyester support. The Melinex 516 substrate is peeled away after lamination, leaving the adhesive and photosensitive layers on the support. The yellow photosensitive layer is then exposed to actinic light through a photographic separation for the yellow color. The support with the exposed yellow layer is then immersed for 15 seconds in developer formulation II as described above at 27° C. with gentle pad rubbing on the photosensitive side. The nonexposed, yellow areas are thereby washed off and the exposed areas remain during development. The adhesive layer is not affected by the developer. After this treatment, the imaged material is rinsed and then dried. The magenta composite is then laminated as before onto the imaged, yellow side of the support. The substrate is removed as before. The magenta layer is then exposed through the magenta separation. It is then processed as with the yellow. The magenta is followed in a like manner by cyan and then by black. A 3 mil Melinex 377 matte temporary support is coated with protective layer solution using formulation I as described above to a dry coating weight of 4g/m$^2$. The protective layer is laminated to the four color, imaged material, with subsequent removal of the temporary support. A four color proof with a protective matte finish is produced which is an accurate representation of the original from which the separations are prepared. The protected imaged material does not cohesively block at 70° C. Without the protective layer, the imaged material blocks at this temperature and also at 50° C.

EXAMPLE 2

Four photosensitive, positive-working solutions of cyan, yellow, magenta, and black are produced according to the following photosensitive formulations:

|  | Cyan | Yellow | Magenta | Black |
| --- | --- | --- | --- | --- |
| diacetone alcohol | — | 11.74 | — | — |
| methyl ethyl ketone | 35.52 | 34.45 | 24.23 | 38.62 |
| gamma butyrolactone | 22.60 | 11.15 | 24.04 | 5.74 |
| Dowanol PM | 34.76 | 35.21 | 44.94 | 48.34 |
| Scripset 540 | 1.60 | 2.01 | 2.15 | 2.39 |
| SMA 2625 | 1.74 | 1.17 | — | 0.60 |
| Butvar B-90 | 0.58 | 0.59 | 0.67 | 0.30 |
| Above diazide from U.S. Pat. No. 4,407,926 | 2.09 | 2.58 | 2.81 | 2.72 |
| phthalo blue pigment | 1.11 | — | — | — |
| yellow pigment | — | 1.08 | — | — |
| magenta pigment | — | — | 1.15 | — |
| black pigment | — | — | — | 1.29 |
| optical density | 1.2 | 1.0 | 1.4 | 1.6 |

Scripset and Butvar resins are available from Monsanto, SMA resin is available from Arco, and Dowanol PM is propylene glycol monomethyl ether available from Dow.

The pigment is introduced as a dispersion of methyl ethyl ketone, Scripset 540, and the appropriate pigment. The solutions are coated and dried separately to the required optical density onto four 3 mil Melinex 516 polyester substrates. The surface densities are roughly 1.2g/m² for cyan, 1.4g/m² for yellow, 2.0g/m² for magenta, and 1.0g/m² for black. The adhesive solution, in particular adhesive formulation II as described above for the photosensitive layer, is coated on top of the photosensitive layers and dried to a surface density of 12g/m². The yellow composite is then laminated at 90° C. via the layer to a 7 mil Melinex 3020 white polyester support. The Melinex 516 substrate is peeled away after lamination, leaving the adhesive and photosensitive layers on the support. The yellow photosensitive layer is then exposed to actinic light through a photographic separation for the yellow color. The support with the exposed yellow layer is then immersed for 15 seconds in developer formulation II as described above at 27° C. with gentle pad rubbing on the photosensitive side. The exposed, yellow areas are thereby washed off and the nonexposed areas remain during development. The adhesive layer is not affected by the developer. After this treatment, the imaged material is rinsed and then dried. The magenta composite is then laminated as before onto the imaged, yellow side of the support. The substrate is removed as before. The magenta layer is then exposed through the magenta separation. It is then processed as with the yellow. The magenta is followed in a like manner by cyan and then by black. A 3 mil Melinex 377 matte temporary support is coated with protective layer solution using formulation II as described above to a dry coating weight of 8g/m². The protective layer is laminated to the four color, imaged material, with subsequent removal of the temporary support. A four color proof with a protective matte finish is produced which is an accurate representation of the original from which the separations are prepared. The protected imaged material does not cohesively block at 70° C. Without the protective layer, the imaged material blocks at this temperature and also at 50° C.

What is claimed is:

1. A method for protecting an image which comprises
   (A) providing a colored image on a support;
   (B) providing a protective layer disposed on a release surface of a temporary support; wherein said layer is a single, thin, transparent, flexible, nonself supporting, composition layer; wherein said layer is substantially nontacky at room temperature; and wherein said layer comprises at least a major amount based on the weight of the layer of one or more thermoplastic resins having a Tg of about 35° C. to about 110° C.; wherein said layer does not cohesively block at temperatures of about 50° C. or less; and
   (C) laminating said layer directly to said colored image with pressure and heat at temperatures of between 60° C. and about 180° C.; and
   (D) peeling away said temporary support thus leaving the protective layer on the colored image.

2. The method of claim 1 wherein said temporary support comprises polyethylene terephthalate.

3. The method of claim 1 wherein the surface of the temporary support adjacent to said protective layer has a matte texture.

4. The method of claim 1 wherein the surface of the temporary support adjacent to said protective layer has a glossy texture.

5. The method of claim 1 wherein said lamination is conducted at a temperature of from about 60° C. to about 110° C.

6. The method of claim 1 wherein the surface of the colored image has a matte texture.

7. The method of claim 1 wherein the surface of the colored image has a glossy texture.

8. The method of claim 1 wherein said protective layer has a thickness of from about 0.2 um to about 20 um.

9. The method of claim 1 wherein said thermoplastic resin or resins in the protective layer comprises one or more materials selected from the group consisting of vinyl acetal polymers and copolymers, vinyl chloride containing copolymers and acrylic polymers and copolymers.

10. The method of claim 9 wherein said thermoplastic resin or resins in the protective layer comprises polyvinyl butyral.

11. The method of claim 1 wherein said protective layer further comprises one or more ingredients selected from the group consisting of plasticizers, uv absorbers, surfactants, antistatic compositions, optical brighteners, inert fillers, and antihalation agents.

* * * * *